United States Patent [19]
Ryan, Sr. et al.

[11] 3,811,182

[45] May 21, 1974

[54] OBJECT HANDLING FIXTURE, SYSTEM, AND PROCESS

[75] Inventors: William J. Ryan, Sr., Jericho; Edward F. Schirmer, South Burlington; Nandor G. Thoma, Jericho; James H. Tolley, Essex Center; Donald L. Wilder, Colchester, all of Vt.

[73] Assignee: International Business Machines Corporation, Armonk, N.Y.

[22] Filed: Mar. 31, 1972

[21] Appl. No.: 240,018

[52] U.S. Cl. .................... 29/574, 225/93, 225/103, 209/73, 209/81, 29/589, 29/203, 29/583

[51] Int. Cl. ........................................ B01j 17/00

[58] Field of Search ............ 29/574, 583, 589, 569, 29/203 V, 412, 413; 209/73, 81; 225/93, 103

[56] References Cited

UNITED STATES PATENTS 3,720,309 3/1973 Weir ................................ 29/574

*Primary Examiner*—W. Tupman

*Attorney, Agent, or Firm*—Francis J. Thornton

[57] ABSTRACT

A system for handling an oriented array of objects, such as integrated circuit chips, includes a fixture in which the chips are held in place by vacuum means. A chip placement tube is capable of reciprocal motion normal to the plane of the fixture to move a chip unidirectionally from its position in the array for placement on a substrate. The system further includes means for positioning a substrate precisely with respect to a chip in the array to allow its direct placement from the array. This fixture and system allows the precise orientation and alignment of semiconductor chips in a wafer to be maintained for laser dicing and chip positioning on a substrate without requiring reorientation. When combined with testing and inspection apparatus and a suitable memory, the system further allows handling and processing of chips to be minimized.

9 Claims, 6 Drawing Figures

OBJECT HANDLING FIXTURE, SYSTEM, AND PROCESS

1. Field of the Invention

This invention relates to a system and fixture for handling an oriented array of objects in which the orientation of the objects is maintained during their handling and in which the objects may be precisely positioned at a location remote from the array, without requiring the maintenance of precision tolerances between the objects and the fixture or system. More particularly, it pertains to such a fixture and system in which direct placement of objects from a precisely oriented and aligned array to a precisely predetermined location is carried out.

2. Description of the Prior Art

In certain respects, the present invention is an improvement in the invention disclosed and claimed in commonly assigned Schirmer, U.S. Pat. No. 3,584,741. The fixture and system of that patent allows objects, such as semiconductor chips, to be tested and sorted while maintaining a predetermined direction of orientation in the objects. In the embodiment there disclosed, a matrix of vacuum pickups having dimensions of a predetermined tolerance with respect to integrated circuit chips to be sorted is provided.

Requiring a precision dimensional relationship between handling apparatus and integrated circuit chips is an approach that is highly suitable for integrated circuit chips currently being manufactured. However, some variation in the size of integrated circuit chips does occur, and sufficient allowance is required for this in handling apparatus of the type disclosed by Schirmer. In the case of advanced integrated circuit chips currently undergoing development, more precision in orientation and alignment of these chips is required for placement of them on contact lands of a substrate than can be afforded by the Schirmer embodiment with its required allowances for different chip size.

SUMMARY OF THE INVENTION

Accordingly, it is an object of the invention to provide a fixture and system for handling objects which have a predetermined alignment and orientation at a given location, in which the objects may be moved and precisely positioned at another location without losing their alignment or orientation and without requiring a precision tolerance between parts of a fixture or system and the objects.

It is another object of the invention to provide a fixture and system for handling semiconductor chips in which the precision alignment and orientation of the chips in an undiced wafer is maintained, independent of normal variations in chip size, through placement of the chips on a substrate.

It is yet another object of the invention to provide a fixture for handling integrated circuit chips in which a precision tolerance between parts of the fixture and the chips is not required, yet the orientation and alignment of the chips are maintained for positioning on a substrate.

It is still another object of the invention to provide a system for use in manufacturing integrated circuits in which integrated circuit wafers are tested, diced into chips without substantially disturbing the alignment and orientation of integrated circuits in the wafer, and the chips are positioned on a substrate while maintaining their orientation and alignment.

It is a further object of the invention to provide a system in which integrated circuit chips in an oriented and aligned array are tested, a substrate is precisely oriented with respect to a chip passing the test in the array, and the chip is precisely positioned on the substrate, all without losing the orientation and alignment of deposited chips.

It is a still further object of the invention to provide a system for handling integrated circuit chips in which orientation and alignment of the chips is maintained through placement on a substrate, and in which chips meeting test specifications are selectively diced from the wafer without losing their orientation and alignment.

These and related objects may be attained with the fixture and system herein disclosed. A system for handling an oriented and aligned array of objects in accordance with the invention includes means for releasably holding the objects in their oriented and aligned positions. In cooperative relationship with the holding means is a means for moving the objects individually in a unidirectional manner from their oriented and aligned positions. Means is provided for positioning a receiving member to receive an object from the moving means. Means engages the moving means to cause it to move an object from its oriented and aligned array position to the receiving member. In a system adapted to handle an array of semiconductor chips, the system preferably further includes a means for precision alignment of a semiconductor wafer containing an array of semiconductor devices for dicing. Means is further provided for dicing the wafer into chips without substantially disturbing the orientation and alignment of the semiconductor devices on the chips.

For use with semiconductor device or integrated circuit chips, a fixture may be incorporated in the system which includes a housing forming an enclosed chamber. A top surface of the housing is adapted to receive a wafer containing a plurality of semiconductor device or integrated circuit chips. The surface has at least one chip vacuum clamping passageway for each chip passing through the top surface to the enclosed chamber for holding each chip in its array position. Means is provided for connecting a source of vacuum to the enclosed chamber. A chip placement access passageway passes through the top surface for each chip in the wafer. A chip placement tube capable of reciprocal motion normal to the plane of the top surface through the chip placement access passageway for each chip is provided. Means connects a source of vacuum to the chip placement tube in order to allow it to engage a chip diced from the wafer and provide it for chip placement on a substrate without disturbing the orientation and alignment of the chip.

For use with semiconductor device or inetegrated cicuit chips, the system may include a testing means for the chips, capable of determining whether a chip is suitable for placement on a substrate. A memory means is connected to the testing means and the chip placement tube moving means. This allows locations on the substrate at which a chip is to be bonded to be positioned and the chip placement tube to be moved only to chips determined to be qualified for placement on the substrate. An even more advantageous system includes a second testing means for the chips after they have been placed on the substrate, the second testing means also being connected to the memory means. In the case of substrates carrying a substantial number of chips, a rework means may also be connected to the memory means for removing defective chips on the substrate and replacing them with another chip.

The system and fixture of this invention results in a substantial improvement in the handling of such objects as integrated circuit chips, because it does not require a predetermined tolerance between the objects and the fixture or system, yet allows very precise orientation and alignment of the objects to be maintained while moving them from an array position to a receiving member. While the fixture and system are particularly adapted for handling semiconductor device and integrated circuit chips, it should be apparent that the invention is of value in handling a wide variety of electrical components or other objects in an array which must be precisely positioned at a remote location from their array position.

The foregoing and other objects, features, and advantages of the invention will be apparent from the following more particular description of the preferred embodiments of the invention, as illustrated in the accompanying drawings.

DESCRIPTION OF THE PREFERRED EMBODIMENTS

Chip Handling Fixture

Figure 1:
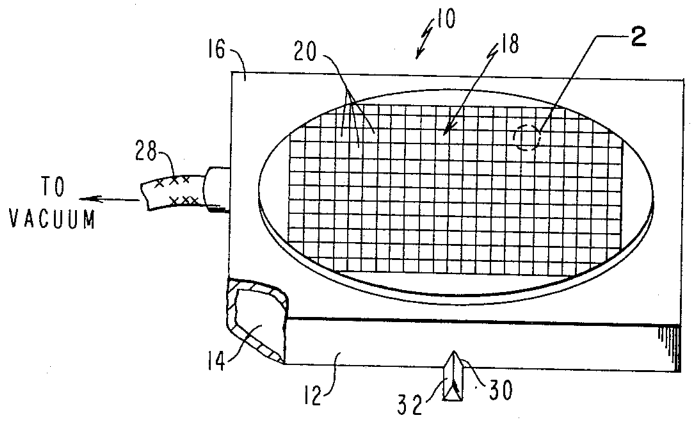
FIG. 1 is a perspective view of a fixture in accordance with the invention, with a partial cutaway to show interior detail.
Figure 2:
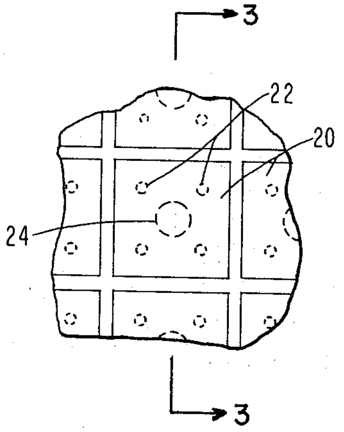
FIG. 2 is an enlarged plan view of the area 2 shown in FIG. 1.
Figure 3:
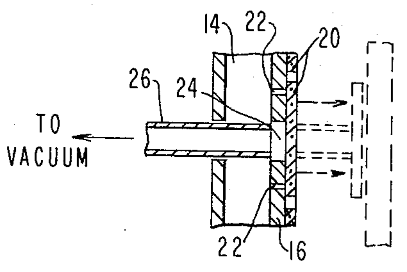
FIG. 3 is a cross section view taken along the line 3—3 in FIG. 2.

Turning now to the drawings, more particularly to FIGS. 1–3, there is shown an integrated chip handling fixture 10. The fixture has a housing 12 forming enclosure 14. Top surface 16 of housing 12 is adapted to receive semiconductor wafer 18, which contains a plurality of integrated circuit chips 20. Top surface 16 of fixture 10 has, as shown in FIGS. 2 and 3, a plurality of chip vacuum clamping passageways 22 extending through it to enclosed chamber 14. A chip placement access passageway 24 also passes through top surface 16 of the fixture 10 for each integrated circuit chip 20. A chip placement tube 26 cooperatively engages housing 12 of fixture 10 and is capable of reciprocal motion normal to the plane of top surface 16 through access passageway 24 provided for each chip. If desired, a separate chip placement tube 26 may be provided for each chip 20, or a single chip placement tube 26 may be successively registered to access passageway 24 of each integrated circuit chip 20.

Vacuum line 28 is connected to a source of vacuum (not shown). Registration slot 30 on housing 12 may engage a registration member 32 which forms a part of apparatus in a chip handling system with which the fixture 10 is used.

Figure 4:
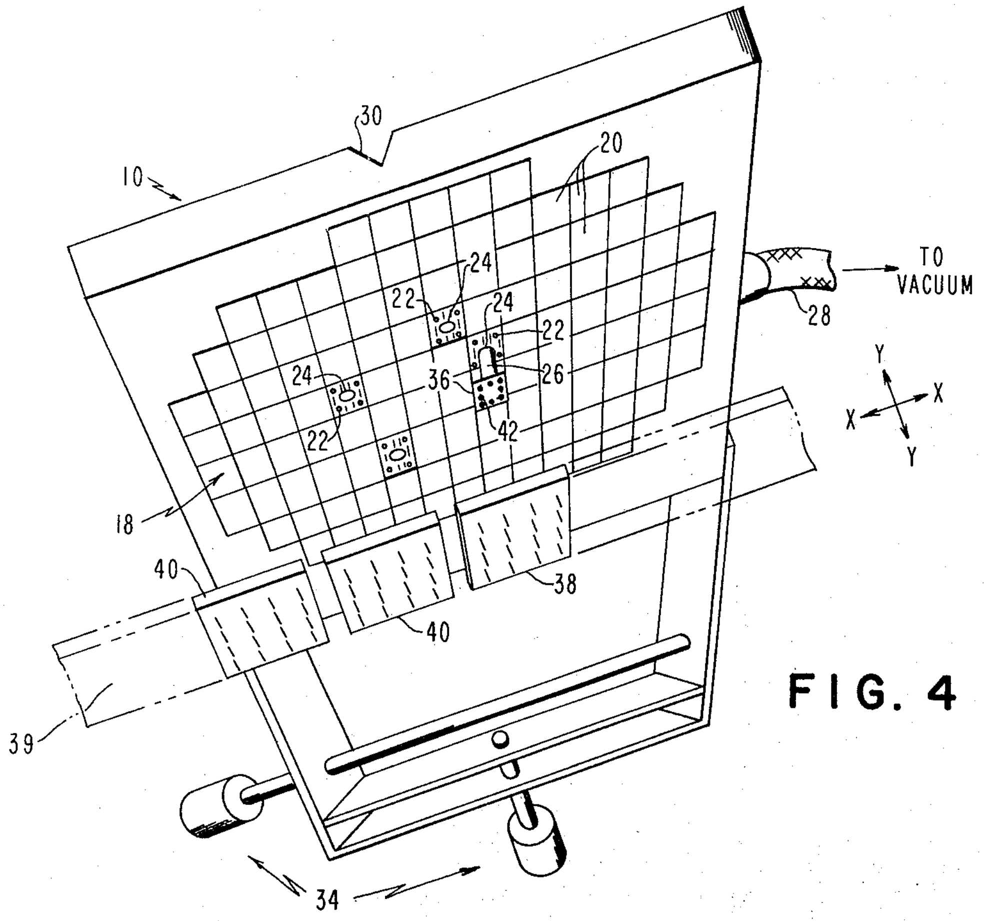
FIG. 4 is a perspective view of the fixture of FIGS. 1–3, showing its use for chip placement in a system in accordance with the invention.

Turning now to FIG. 4, the use of fixture 10 for chip placement is shown. Prior to chip placement, the wafer 18 containing integrated circuit chips 20 has been diced with a technique that will cut the wafer into the individual chips 20 without disturbing their orientation and alignment, as maintained by chip vacuum clamping passageways 22. This is best accomplished by laser dicing. For chip placement, the fixture 10 is inverted and mounted on a suitable chip placement apparatus including X - Y positioning mechanism 34 for positioning a particular chip, such as chip 36, over contact land (not shown) on module substrate 38 on which chip 36 is to be positioned, by moving the fixture 10, the substrate 38, or both along the X - Y axes shown in FIG. 4. In use, means 39 for moving other substrates 40 to the position of module substrate 38 are provided. When a substrate is in the position of substrate 38, it is necessary to align contact lands on its surface very precisely with contact pads 42 on chip 36. This may be accomplished through the use of suitable positioned mirrors and a split field microscope (not shown).

When the lands on substrate 38 have been precisely aligned with respect to contact pads 42 on chip 36, chip placement tube 26 is lowered through chip placement access passageway 24 with a vacuum being pulled through the tube to engage chip 36. This breaks the vacuum force through chip vacuum clamping passageways 22 holding chip 36 in its place in the array and moves chip 36 towards substrate 38, as shown. When chip 36 has been fully lowered to substrate 38, the vacuum through chip placement tube 26 is turned off, thus releasing chip 36, the chip placement tube 26 is retracted through access passageway 24, and another nondefective chip is registered for placement on substrate 38.

FIG. 4 shows other sets of chip vacuum clamping passageways 22 and chip placement access passageways 24 from which chips have already been placed. With a suitable vacuum connected to line 28, it is possible to place all of the chips from a wafer 18 while maintaining sufficient force through chip vacuum clamping passageways 22 to hold the last chip to be placed on fixture 10. In the usual fabrication of integrated circuits, however, all of the integrated circuits in wafer 18 will not meet test specifications, and therefore not all of the chips 20 will be placed.

Chip Handling and Placement Process

Figure 5:
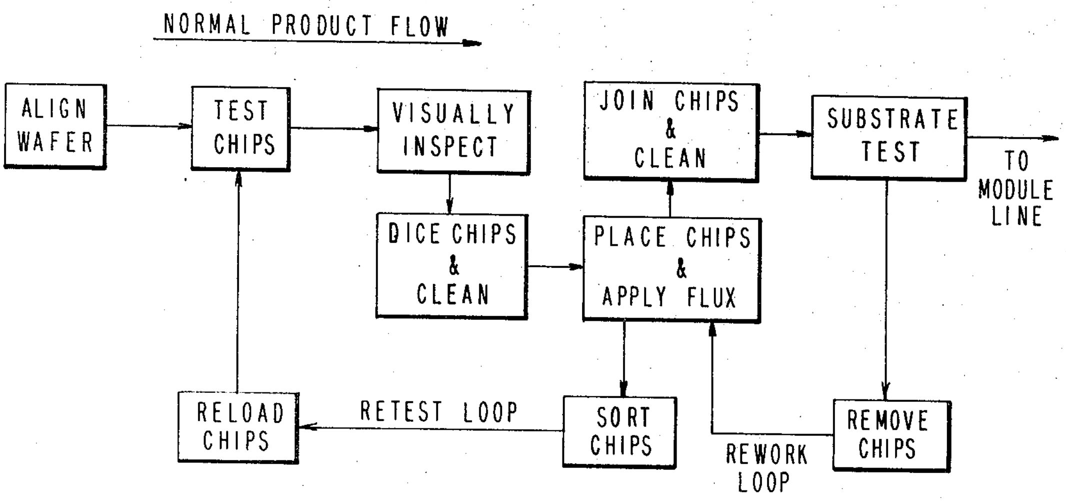
FIG. 5 is a flow diagram showing steps in the handling of integrated circuit chips in which the fixture of FIGS. 1–4 may be used.

The flow diagram of FIG. 5 shows a portion of an integrated circuit manufacturing and chip placement process in which the fixture of FIGS. 1–4 may be employed. In the process, a semiconductor wafer containing a completed array of integrated circuits is aligned to a fixture as in FIGS. 1–4 and clamped to the fixture by chip vacuum clamping passageways 22 at each chip in the array. The chips pass through to placement on the fixture. The chips are first DC, AC or both DC and AC electrically tested, then visually inspected. A record is kept of which chips in the wafer fail the test or inspection. The wafer is then laser diced into chips and residue from the dicing is cleaned off the chips. The laser dicing and cleaning operation can be carried out without disturbing the orientation and alignment of the chips as it existed in the wafer prior to dicing.

After dicing, the chips passing the test and inspection are ready for placement on substrates, as shown in FIG. 4. Flux is then applied to the chips and they are solder reflow bonded to the substrates in a suitable solder reflow furnace, followed by a conventional cleaning operation to remove excess flux and any other contaminant introduced as a result of the solder reflow operation. The chips on the substrate are again tested to make sure that only integrated circuit chips meeting specifications are present on the substrate. If all of the chips on the substrate meet the test criteria, the substrate continues in further processing to produce a packaged integrated circuit module. If one or more of the chips on the substrate fails the substrate test, it is necessary to remove the defective integrated circuit chip and replace it with a chip meeting test specifications. The defective chips are removed from the substrate, and the substrate passed through a rework loop as shown for replacement of the removed defective chips. A particularly advantageous tool for use in removing the defective chips is the subject matter of commonly assigned Ward, application Ser. No. 139,063, filed Apr. 30, 1971, now U.S. Pat. No. 3,735,911, the disclosure of which is incorporated by reference herein.

Returning to the chip placement operation, the chips which were indicated as failing the test or inspection prior to dicing are sorted and retested, since it is often that an indication of test failure is due to some other cause than an actual defect in the chip. In the case of visual inspection particularly, a chip indicated as a failure from visual inspection may in fact turn out to be suitable for use. After retesting, those chips meeting the testing and inspection specifications are returned to the normal product flow.

Chip Handling and Placement System

Figure 6:
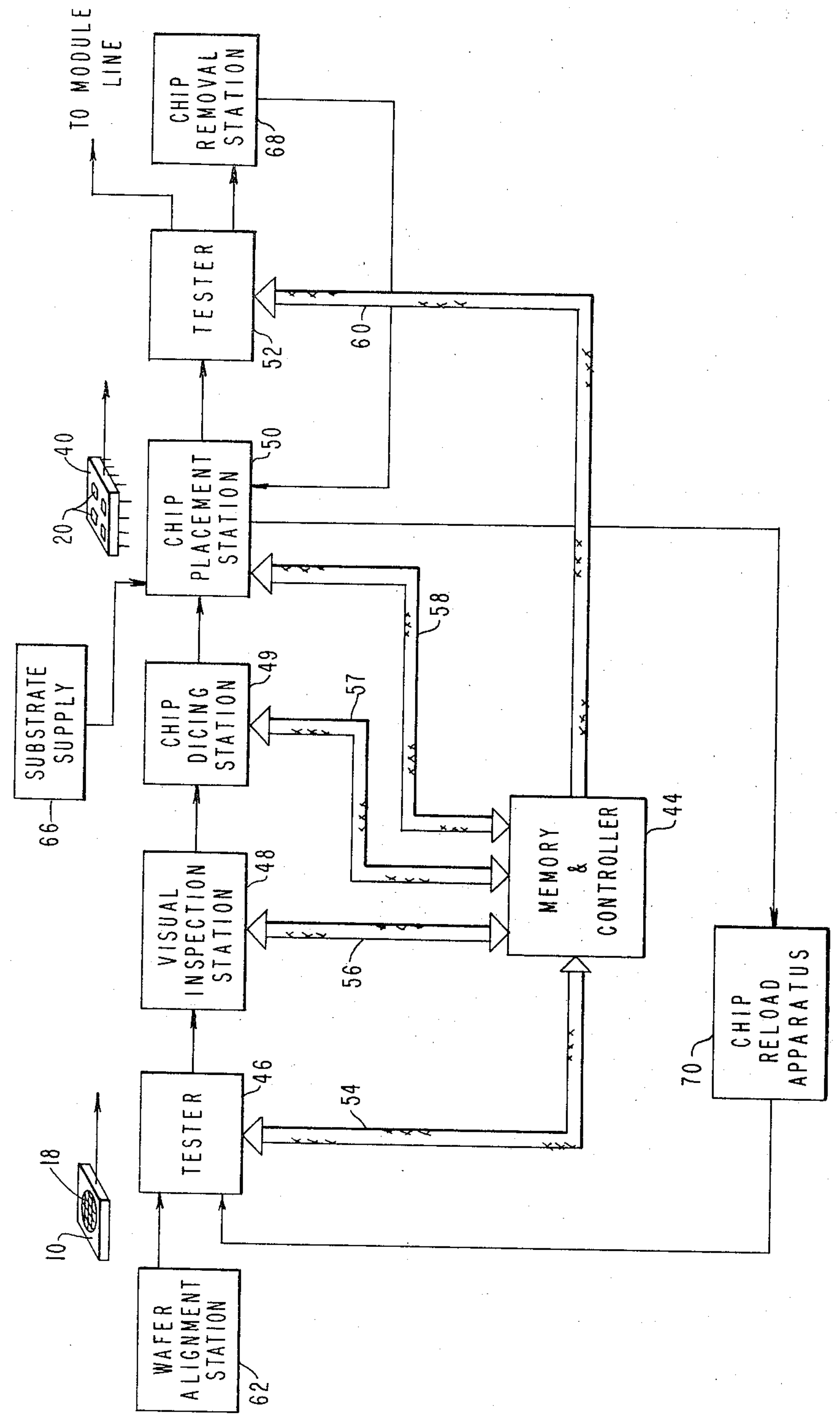
FIG. 6 is a block diagram of a system in accordance with the invention, in which the fixture of FIGS. 1–4 may be used, and in which the steps shown in FIG. 5 may be carried out.

Turning now to FIG. 6, there is shown a schematic diagram of a perferred system for carrying out a process of the type shown in the flow diagram of FIG. 5, which may incorporate the fixture of FIGS. 1–4. Shown is a memory and controller 44 to which a tester 46, a visual inspection station 48, a chip dicing station 49, a chip placement station 50, and a tester 52 are connected by busses 54, 56, 57, 58, and 60, respectively. The memory and controller 44 may be that of, for example, a general purpose process control data processing machine, such as an IBM Model 1800 process control computer. The testers 46 and 52, the visual inspection station 48, and the chip placement station 50 may be of a conventional type known in the art, except that they should be capable of receiving a fixture of the type shown in FIGS. 1–4.

A wafer alignment station 62 is provided to align a wafer 18 very precisely on a fixture 10. The aligned wafer on the fixture is then transferred to tester 46 for electrical testing. From the tester 46, the carrier 10 with its wafer 18 moves to visual inspection station 48, then to chip dicing station 64. The chip dicing station 49 is preferably of the laser type, such as may be obtained from Quantronics Corporation, Smithville, N.Y. After dicing, the fixture 10, now carrying the individual diced chips with the orientation and alignment as in wafer 18 maintained, is transferred to chip placement station 50. Substrates 40 on which chips 20 are to be positioned are provided from substrate supply 66 to chip placement station 50, and chip placement is carried out as explained above with reference to FIG. 4. After chip placement, the substrates 40 containing chips 20 move to tester 52 where the chips 20 undergo another electrical test.

If all of the chips 20 on substrate 40 meet the test specification as determined by tester 52, the substrate 40 continues on to further processing in a module line. If one or more of the chips 20 are defective, the substrate 40 is transferred to chip removal station 68, which is preferably of the type disclosed in the above-referenced Ward application. After removal of the defective chips, the substrate 40 is returned to the chip placement station for replacement of the defective chips.

Defective chips not placed by chip placement station 50 are provided to a chip reload apparatus 70, where they are repositioned on a fixture 10 for retesting, then returned to tester 46. For a variety of reasons, a substantial proportion of chips thought to be defective originally in fact pass the tests when recycled.

Because the tester 46, inspection 48, chip dicing station 49 chip placement station 50 and tester 52 are connected to memory 44, excess handling of defective chips can be avoided. Thus, visual inspection station 48 can be controlled by the results obtained from tester 46 through memory and controller 44 to step the visual inspection only to chips passing the electrical tests of tester 46. If the yield of non-defective integrated circuits in the wafer 18 is relatively low, the laser dicing operation can be controlled by memory and controller 44 to dice the non-defective chips individually from the wafer 18, rather than dicing all of the chips. Similarly, only chips passing the electrical tests and the visual inspection are placed by chip placement station 50. Since tester 52 will identify which chips on a substrate 40 are to be replaced, chip placement station 50 need only step to those positions on substrate 40.

It should now be apparent that an object handling fixture and system capable of achieving the stated objects of the invention have been provided. Because the fixture allows direct, unidirectional placement of objects from a precisely oriented and aligned position in an array on the fixture to a receiving member, the original precision in the array is carried through to placement. The system allows wasted handling and processing of defective objects to be eliminated. This invention allows the most sophisticated integrated chips now undergoing development to be handled and precisely positioned on substrates automatically.

While the invention has been particularly shown and described with reference to the preferred embodiments thereof, it will be understood by those skilled in the art that various changes in form and details may be made therein without departing from the spirit and scope of the invention.

What is claimed is:

1. A system for handling an oriented and aligned semiconductor wafer comprising:

means for releasably holding the wafer in an oriented and aligned position, said semiconductor wafer having first and second surfaces, said first surface having an array of semiconductor devices for dicing and a plurality of contact pads thereon, said means for releasably holding the wafer contacting said second surface of said wafer, means for dicing the wafer into chips without substantially disturbing the orientation and alignment of said semiconductor devices on the chips, means contacting said second surface for moving the diced chips individually in a unidirectional manner from their oriented and aligned positions, means for positioning a receiving member having contact lands on a surface thereof to receive a diced chip from said moving means, and means engaging said moving means to cause it to move a diced chip from its oriented and aligned array position directly to said receiving member to cause the contact pads on said first surface to contact the contact lands on said receiving member.

2. A fixture for alignment and placement of semiconductor chips on a substrate, comprising:

A. a housing forming an enclosed chamber,

B. a top surface of said housing adapted to receive a semiconductor wafer containing a plurality of semiconductor chips, a chip vacuum clamping passageway passing through said surface to said enclosed chamber for each chip in the wafer, D. means for connecting a source of vacuum to said enclosed chamber, E. a chip placement access passageway passing through said top surface for each chip in the wafer, F. a chip placement tube capable of reciprocal motion normal to the plane of said top surface through said access passageway provided for each chip, and G. means for connecting a source of vacuum to said chip placement tube.

3. The fixture of claim 2 in which said semiconductor chips are integrated circuit chips.

4. A system for handling integrated circuit chips, comprising:

A. a fixture as in claim 2,

B. means engaging said fixture for precision alignment of the wafer carried by said fixture for dicing the wafer into chips each containing an integrated circuit, C. means for dicing the wafer into chips without substantially disturbing the orientation and alignment of the chips on said fixture, and D. means for positioning a substrate to receive an integrated circuit chip from said reciprocating chip placement tube for bonding to the substrate.

5. The system of claim 4 in which the substrate is adapted to have a plurality of integrated circuit chips bonded to it, the system further comprising:

E. means to position different locations of the substrate on which a chip is to be bonded in position to receive a different chip from the chips carried by said fixture, and F. means for successively moving said chip placement tube to said chip placement passageway corresponding to a chip to be positioned on the substrate.

6. The system of claim 5 additionally comprising:

G. a first testing means for the integrated circuits carried by said fixture, capable of determining whether a chip is suitable for placement on the substrate, H. memory means connected to said testing means, and I. control means connected to said chip placement tube moving means, whereby locations on the substrate at which a chip is to be bonded may be positioned and said chip placement tube may be moved only to chips determined to be qualified for placement on the substrate.

7. The system of claim 6 additionally comprising:

I. a second testing means for said chips after they have been placed on the substrate, said second testing means also connected to said memory means.

8. The system of claim 7 additionally comprising:

J. rework means connected to said control means for removing a defective chip on the substrate and replacing it with another chip.

9. The system of claim 6 in which said means for dicing is also connected to said control means, and in which said means for dicing selectively dices only chips determined to be qualified for placement on the substrate.

* * * * *